(12) United States Patent
Grosso et al.

(10) Patent No.: US 11,735,684 B2
(45) Date of Patent: Aug. 22, 2023

(54) METHOD FOR MANUFACTURING A LIGHT-EMITTING DEVICE

(71) Applicant: OSRAM GmbH, Munich (DE)

(72) Inventors: Davide Grosso, Ponzano Veneto (IT); Thomas Rieger, Aufhausen (DE); Hans Layer, Ulm (DE)

(73) Assignee: OSRAM GMBH, Munich (DE)

( * ) Notice: Subject to any disclaimer, the term of this patent is extended or adjusted under 35 U.S.C. 154(b) by 306 days.

(21) Appl. No.: 17/283,973

(22) PCT Filed: Oct. 10, 2019

(86) PCT No.: PCT/EP2019/077509
§ 371 (c)(1),
(2) Date: Apr. 9, 2021

(87) PCT Pub. No.: WO2020/074654
PCT Pub. Date: Apr. 16, 2020

(65) Prior Publication Data
US 2021/0351317 A1 Nov. 11, 2021

(30) Foreign Application Priority Data
Oct. 12, 2018 (DE) ...................... 10 2018 217 465.2
Oct. 12, 2018 (DE) ...................... 10 2018 217 469.5

(51) Int. Cl.
*H01L 33/00* (2010.01)
*H01L 33/46* (2010.01)
(Continued)

(52) U.S. Cl.
CPC ............ *H01L 33/005* (2013.01); *H01L 33/46* (2013.01); *H01L 33/58* (2013.01); *H01L 33/62* (2013.01);
(Continued)

(58) Field of Classification Search
CPC ............. H01L 33/58; H01L 2933/0058; H01L 33/005; H01L 33/46; H01L 33/62; H01L 2933/0025; H01L 2933/0066
See application file for complete search history.

(56) References Cited

U.S. PATENT DOCUMENTS 5,141,461 A * 8/1992 Nishimura ............ H01J 29/085
156/87
2012/0190140 A1 7/2012 Sorg et al.
(Continued)

FOREIGN PATENT DOCUMENTS

CN 102823084 A 12/2012
DE 102007021009 A1 4/2008
(Continued)

OTHER PUBLICATIONS

International Search Report issued for the PCT Patent Application No. PCT/EP2019/077509, dated Jan. 7, 2020, 12 pages (for informational purposes only).
(Continued)

*Primary Examiner* — Feifei Yeung Lopez
(74) *Attorney, Agent, or Firm* — Viering, Jentschura & Partner MBB

(57) ABSTRACT

A method for manufacturing a light-emitting device may include producing a support having at least one conductor track on a surface of the support. The method may further include producing a reflective coating directly on the at least one conductor track by means of a film transfer method such that the conductor track is substantially covered by the reflective coating and arranging a light-emitting component on or above the reflective coating. The light-emitting component may be electrically conductively connected to the conductor track(s).

12 Claims, 5 Drawing Sheets

(51) Int. Cl.
  *H01L 33/62* (2010.01)
  *H01L 33/58* (2010.01)
(52) U.S. Cl.
  CPC .......... *H01L 2933/0025* (2013.01); *H01L 2933/0058* (2013.01); *H01L 2933/0066* (2013.01)

(56) References Cited

U.S. PATENT DOCUMENTS

| | | |
|---|---|---|
| 2013/0313005 A1 | 11/2013 | Nakamura et al. |
| 2014/0334137 A1 | 11/2014 | Hasenoehrl et al. |
| 2015/0001566 A1 | 1/2015 | Barchmann et al. |
| 2015/0003083 A1 | 1/2015 | Uehara |
| 2016/0111401 A1 | 4/2016 | Lin et al. |

FOREIGN PATENT DOCUMENTS

| | | |
|---|---|---|
| DE | 102010017710 A1 | 1/2011 |
| DE | 102010049333 A1 | 4/2012 |
| DE | 102011083669 A1 | 4/2013 |
| DE | 102016217789 A1 | 3/2018 |
| WO | 2017223255 A1 | 12/2017 |

OTHER PUBLICATIONS

German Search Report issued for the DE Patent Application No. 10 2018 217 469.5, dated Jul. 1, 2019, 10 pages (for Informational purposes only).

German search report issued for corresponding DE patent application No. 10 2018 217 465.2, dated Apr. 24, 2019, 5 pages (for informational purposes only).

\* cited by examiner

METHOD FOR MANUFACTURING A LIGHT-EMITTING DEVICE

CROSS-REFERENCE TO RELATED APPLICATIONS

The present application is a national stage entry according to 35 U.S.C. § 371 of PCT Application No. PCT/EP2019/077509 filed on Oct. 10, 2019; which claims priority to German Patent Application Serial No. 10 2018 217 469.5 filed on Oct. 12, 2018 and German Patent Application Serial No. 10 2018 217 465.2 filed on Oct. 12, 2018; all of which are incorporated herein by reference in their entirety and for all purposes.

TECHNICAL FIELD

In various embodiments, a method for manufacturing a light-emitting device is provided.

BACKGROUND

In the lighting industry, light-emitting devices are formed by arranging light-emitting semiconductor components on printed circuit boards. In this case, the printed circuit boards are used for energizing the light-emitting semiconductor components. The printed circuit boards are flexible printed circuit boards (flexPBC or FPC) or rigid printed circuit boards (PCB) and comprise circuits made of copper conductor tracks. A polymeric mask is applied on the copper conductor tracks, said mask defining contact pads and acting as a solder barrier laterally around the contact pads.

The light-emitting component is connected to contact pads by means of a solder alloy. In this case, the polymeric mask prevents the molten solder alloy from running in an uncontrolled manner on the copper surface of the conductor tracks. In other words: the polymeric mask prevents a solder from flowing away from the regions, i.e. the contact pads, in which it is required in order to ensure a good soldered connection between the light-emitting component and the contact pad.

An accurate positioning of the light-emitting component on the printed circuit board can be ensured by means of the soldered connection. A highly reflective polymeric mask makes it possible to increase the luminous efficiency of the light-emitting device. However, the luminous efficiency still depends on the design of the light-emitting semiconductor component, for example the type of a light-emitting diode, the layout of the light-emitting device, etc.

Applying and curing the conventional polymeric mask and the material costs thereof are very cost-intensive since a relatively thick layer is applied selectively in predefined regions by means of a slow screen printing method or a slow exposure and development process of a mask (LPI method).

Moreover, curing a polymeric mask is a slow process and requires long furnaces, in particular in roll-to-roll manufacturing methods.

In screen printing methods, there is additionally the problem that when printing films on rolls, the screen printing mask is arranged repeatedly along the roll and a plurality of printed structures are thus formed next to one another. In this case, gaps arise between the printed structures. Closing these gaps necessitates passing the roll through the printing device twice.

In order to manufacture flexible printed circuit boards (referred to as flexible printed circuit, FPC), a subtractive method is conventionally used, which involves laminating a metal film onto a flexible substrate, for example a plastics film composed of PET, PEN or PI, over the whole area. Afterward, parts of the metal film are etched chemically in order to obtain a predefined electrical circuit.

Illustratively, in the subtractive method, metal of the metal film is removed wherever metal is not required for the circuit.

The metal film can be a copper film or an aluminum film, for example, and the electrical circuit comprises copper lines and solder pads, for example.

The process of laminating the metal film onto the flexible substrate is conventionally effected with or without adhesive.

In the process, firstly a photosensitive layer is applied on the metal film and exposed and then a non-active layer is washed away chemically and then the metal of the metal film is etched chemically. The chemical etching of the metal film requires extensive use of chemical media and water for rinsing, which is subsequently disposed of with great expenditure. The etching process additionally comprises a large number of process steps which lengthen the process chain, which has an adverse influence on the manufacturing time and manufacturing costs. Some of these process steps mean thermomechanical stress for the plastics film. It is therefore necessary to take account of this stress in the considerations of the circuit design and in the respective evaluation of the circuit design, particularly if thermosensitive materials are used. Moreover, current exposure processes require the film to be cyclically timed and to come to a halt every "x" mm and the film to be stationary for the exposure time. This increases the process times, as a result of which the yield is reduced. The costs for the manufacture of flexible printed circuit boards (FPC) increase as a result of the aspects mentioned above.

Moreover, the etching process appears to be contrary to some developing trends, such as, for example, environmentally compatible (green) technologies, increasing costs for chemical media and disposal of process water, increasing costs of some raw materials and/or a lean production chain.

SUMMARY

In various embodiments, a method for manufacturing a device comprising at least one light-emitting component is provided which makes it possible to reduce or eliminate one or more of the problems mentioned above. By way of example, it is thereby possible to provide a device comprising at least one light-emitting component on a rigid or flexible substrate more effectively, more cost-effectively and/or more environmentally acceptably than heretofore.

In accordance with one aspect, the object is achieved by means of a method for manufacturing a light-emitting device. The method comprises: forming a carrier with at least one conductor track on a surface of the carrier; forming a reflective coating directly on the at least one conductor track by means of a film transfer method in such a way that the conductor track is substantially covered by the reflective coating; and arranging a light-emitting component on or over the reflective coating, wherein the light-emitting component is electrically conductively connected to the at least one conductor track.

The reflective coating is intended to substantially cover the conductor track, for example apart from contact or terminal regions, for example exposed parts of contact pads.

In other words: the reflective coating is a fixed structure that is formed by means of a film transfer method, for example. The film transfer method can be a hot or cold film transfer method, as is used in the packaging industry, for example.

The reflective coating can be formed from a highly reflective material. By way of example, the reflective coating is formed from a material mixture composed of white, inorganic particles, for example composed of $TiO_2$, embedded in a polymer matrix, for example a resin. Alternatively, the light-emitting structure is formed by means of film transfer with metallic particles, for example composed of aluminum or chromium, which are coated by means of physical vapor deposition, in order to selectively cover the at least one conductor track. The light-emitting structure thus formed has a higher adhesion to the carrier and to the conductor track than in a conventional method.

Moreover, regions which are intended to remain free of reflective coating, for example contact pads, can thus be left free in a simple manner.

Moreover, a highly reflective and/or highly flame-resistant reflective coating can be formed by means of the film transfer method. A reflective coating formed in this way can compensate for the flammability of the carrier in order to satisfy a flame resistance requirement of lighting applications. Moreover, by means of the method it is possible to form a multilayered reflective coating. This enables the reflectivity of the reflective coating to be optimally adjusted to the light-emitting component. Moreover, the flame resistance of the light-emitting device can be improved as a result. In this case, there are fewer method restrictions in comparison with conventional polymeric (soldering) masks since they cannot always be formed with the required thickness.

The film transfer method additionally enables a much thinner reflective coating or laterally structured coating than in the case of a conventionally manufactured polymeric (soldering) mask. As a result, less material is required and the light-emitting device becomes able to be formed more thinly overall. This has the effect that the weight of the light-emitting device can be reduced and the mechanical flexibility can be improved. The film transfer method is a very fast method and additionally enables high speed roll-to-roll processing. In comparison therewith, screen printing of a conventional, polymeric mask is effected step by step and has only low productivity. Moreover, by means of the film transfer method, the reflective coating, for example having a thickness of 5 µm, can be formed in a simpler manner and at higher speed, with a smaller material thickness and thus a smaller volume in comparison with a conventional, polymeric (soldering) mask.

The carrier with at least one conductor track can be a flexible printed circuit board (flexPCB or FPC) or a rigid printed circuit board (PCB). The at least one conductor track can be formed from copper or some other material. The carrier can be formed for example from a polymer, for example PET, PEN, PI; or CEM or FR4, as will be described even more thoroughly below. The reflective coating manufactured by means of the method can have edges which are very clear and better defined than a conventionally manufactured polymeric mask, which moreover has a very much greater thickness.

By means of the method, moreover, simpler and highly efficiently processable materials can be used. On account of a short curing time needed, or no curing at all, a higher throughput can be made possible in roll-to-roll applications or in film piece applications.

Moreover, by means of the film transfer method, it is possible to form the reflective coating from a metal. This is not possible with a conventional screen printing method. The metal can have a higher reflectivity than a conventionally formed, polymeric mask. For the reflective coating, it is additionally possible to use metal with specific reflection behaviors, for example a nonlinear reflectance, for example a gold effect, a red shift or a blue shift.

Moreover, compared with the running of deposited ink during the manufacture of a conventional polymeric mask, applied lateral structuring is prevented from being able to run. An ink running in such a way could cause various defects in the flexible printed circuit board, which is prevented by the method in accordance with various exemplary embodiments.

Moreover, no significant thermal stress or no significant thermal strain is exerted on the flexible printed circuit board, which would otherwise occur as a result of a curing process having a long duration in the case of a thermally sensitive carrier, for example in the case of a PET carrier. This makes it possible to increase the design freedom for the light-emitting device. Moreover, the color of the reflective coating can be set in virtually any desired way, whereby the design freedom is further increased.

Equipment for forming the device which is more cost-effective and occupies less space is additionally possible.

The light-emitting device can be formed without UV-curing adhesives that are conventionally used. This enables a light-emitting device having higher UV stability.

BRIEF DESCRIPTION OF THE DRAWINGS

Non-limiting embodiments are illustrated in the figures and are explained in greater detail below. Identical, equivalent or equivalently acting elements are indicated with the same reference numerals in the figures. The figures are schematic illustrations and thus not necessarily true to scale.

Comparatively small elements and particularly layer thicknesses can rather be illustrated exaggeratedly large for the purpose of better clarification.

In the figures:

FIG. 1 shows schematic cross-sectional views concerning the method for manufacturing a device comprising at least one light-emitting component in accordance with various embodiments;

FIG. 2 shows schematic plan views concerning the method for manufacturing a device comprising at least one light-emitting component in accordance with various embodiments;

FIG. 3 shows a schematic cross-sectional view concerning the method for producing a device comprising at least one light-emitting component in accordance with various embodiments;

FIG. 4 shows schematic cross-sectional views concerning the method for manufacturing a device comprising at least one light-emitting component in accordance with various embodiments; and FIG. 5 shows schematic plan views concerning the method for manufacturing a device comprising at least one light-emitting component in accordance with various embodiments.

DETAILED DESCRIPTION

In the following detailed description, reference is made to the accompanying drawings, which form part of this description and show for illustration purposes specific embodiments in which the method can be implemented. In this regard, direction terminology such as, for instance, "at the top", "at the bottom", "at the front", "at the back", "front", "rear", etc. is used with respect to the orientation of the figure(s) described. Since components of embodiments can be positioned in a number of different orientations, the direction terminology serves for illustration and is not restrictive in any way whatsoever. It goes without saying that other embodiments can be used and structural or logical changes can be made, without departing from the scope of protection of the present claims. It goes without saying that the features of the various exemplary embodiments described herein can be combined with one another, unless specifically indicated otherwise. Therefore, the following detailed description should not be interpreted in a restrictive sense, and the scope of protection of the present disclosure is defined by the appended claims.

In the context of this description, the terms "connected", "attached" and "coupled" are used to describe both a direct and an indirect connection, a direct or indirect attachment and a direct or indirect coupling. In the figures, identical or similar elements are provided with identical reference signs, insofar as this is expedient.

Figure 1:
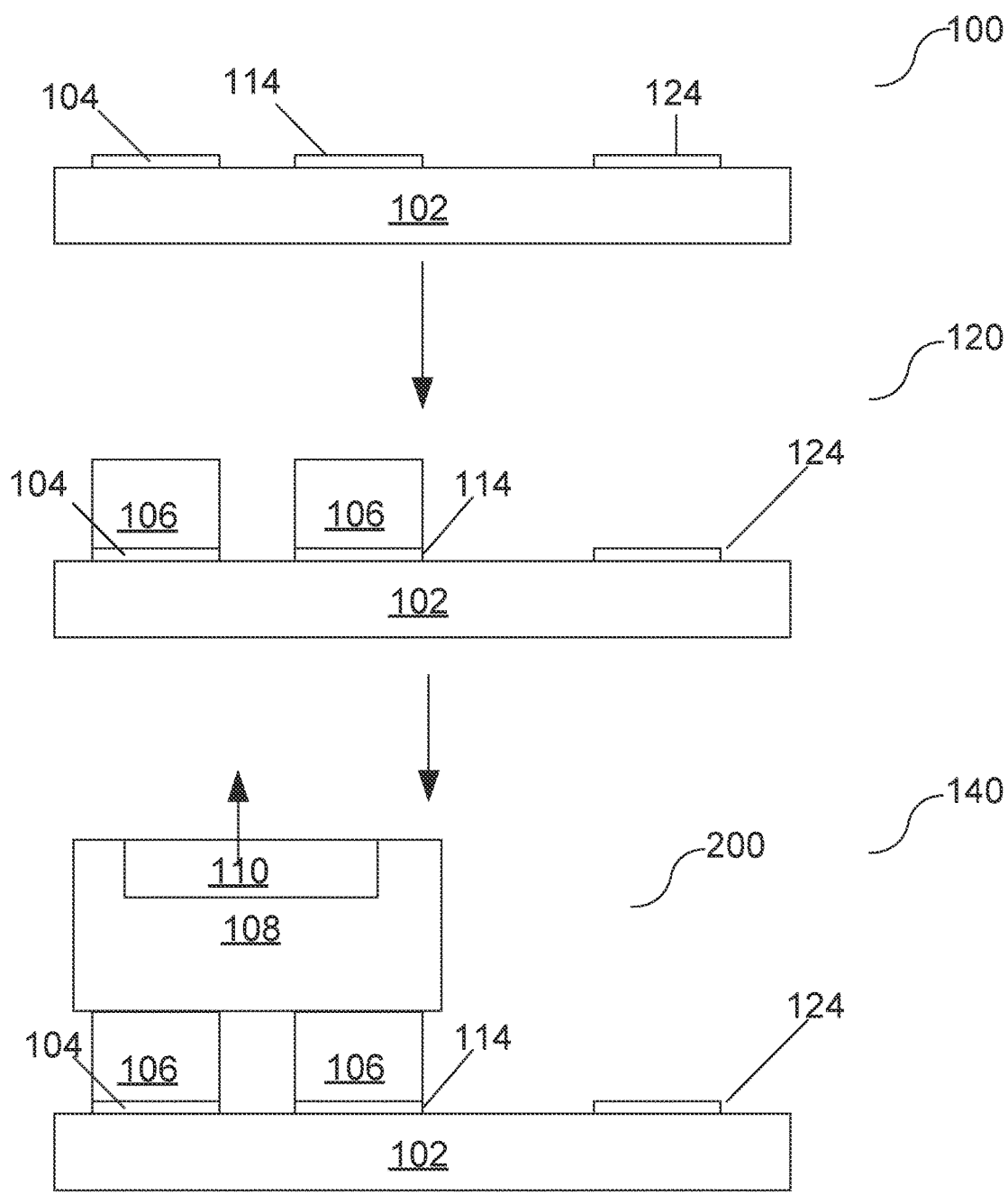
Figure 2:
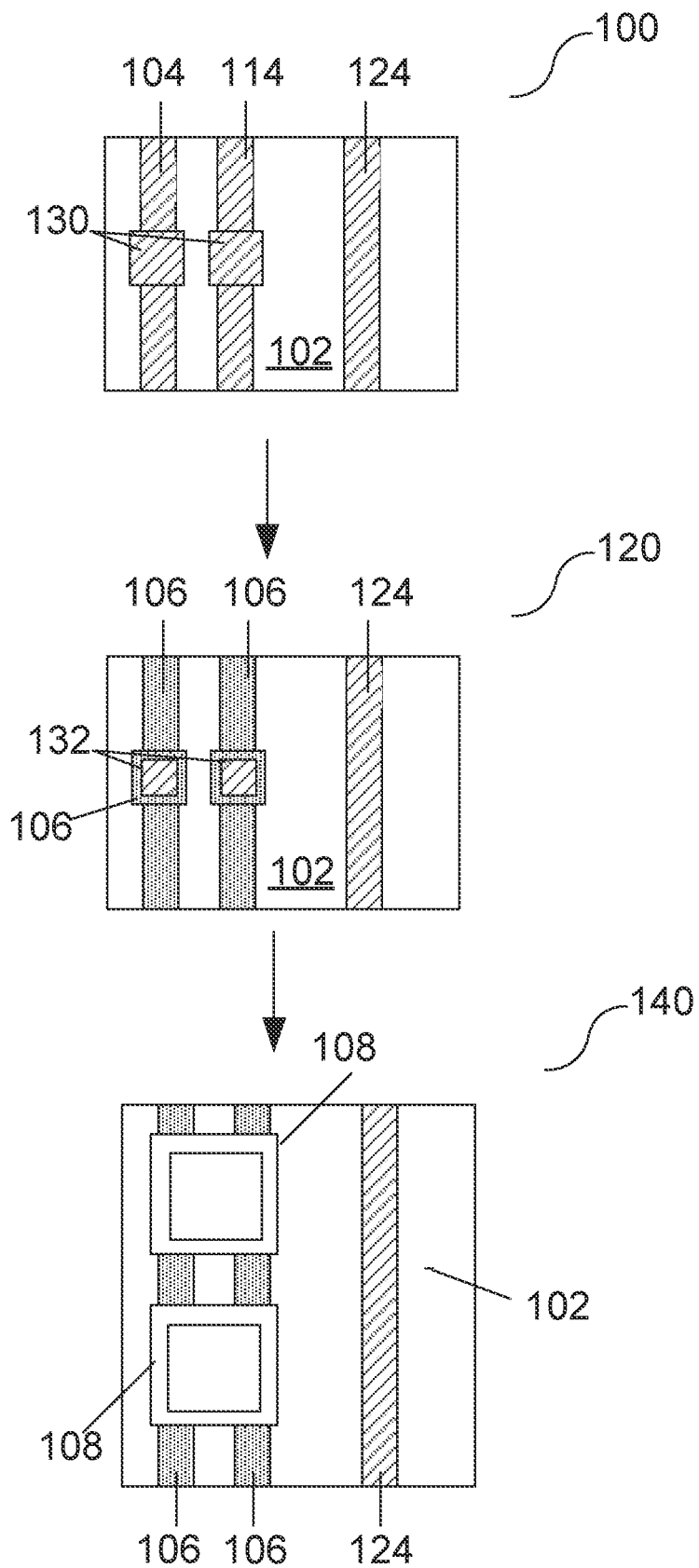

FIG. 1 shows schematic cross-sectional views and FIG. 2 shows schematic plan views concerning the method for manufacturing a device 200 comprising at least one light-emitting component 108 in accordance with various embodiments.

In various exemplary embodiments, a method for manufacturing a light-emitting device comprises forming 100 a carrier 102 with at least one conductor track 104, 114, 124 on a surface of the carrier 102. The forming 100 is providing, for example. The carrier 102 can be a film wound up as a roll. Alternatively, the carrier 102 is an individual film piece, for example handleable in an unrolled fashion.

Figure 3:
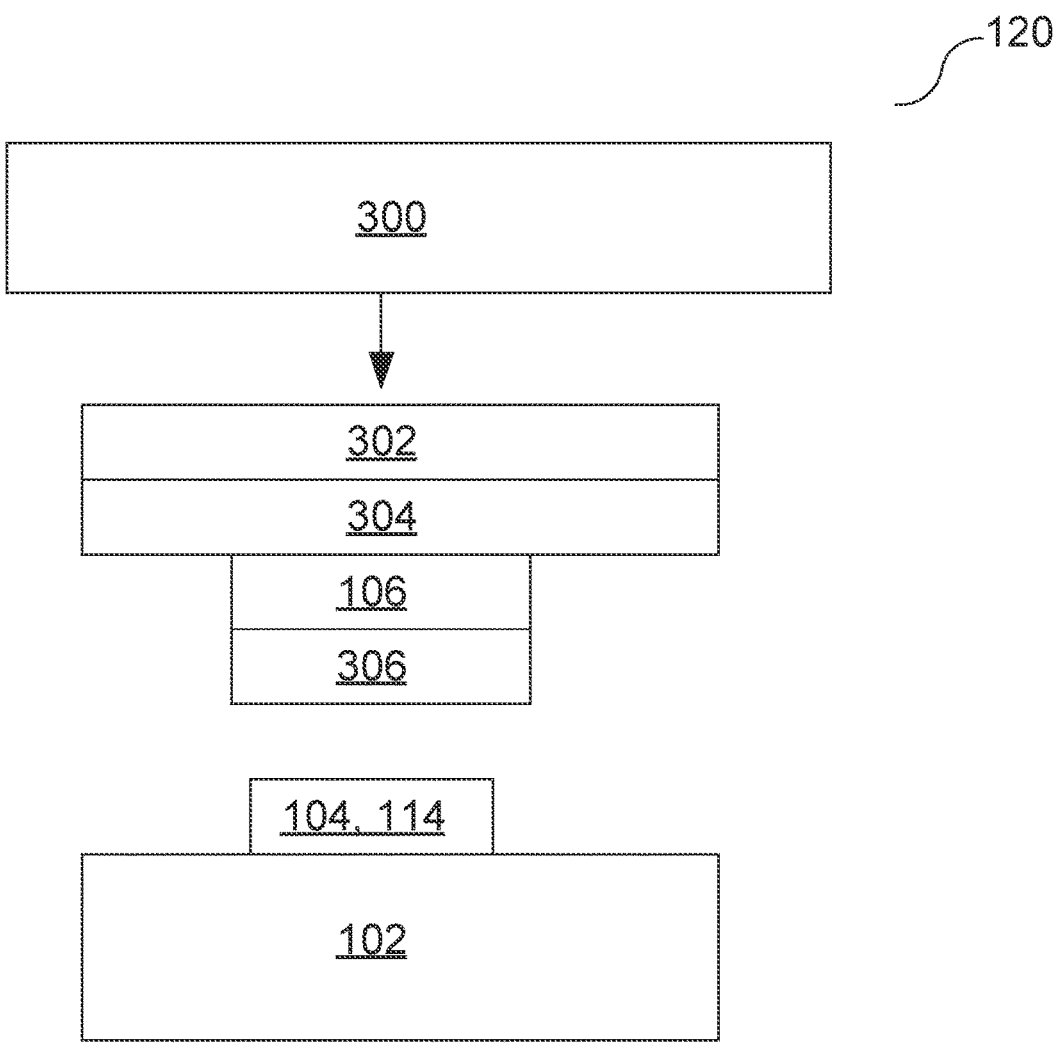

The method furthermore comprises forming 120 a reflective coating 106 directly on the at least one conductor track 104, 114 by means of a film transfer method (see also FIG. 3). In this case, the conductor track 104 is substantially covered by the reflective coating 106.

This makes it possible for a reflective coating to be formed more simply on or over a carrier 102 and/or a conductor track 104. Further advantages are described more thoroughly above or below.

In various exemplary embodiments, the reflective coating 106 is applied on or over the carrier by means of a cold film transfer method. Alternatively, the reflective coating is applied on or over the carrier by means of a hot film transfer method. In the case of a hot film transfer method, in contrast to a cold film transfer method, the carrier 102 and/or the reflective coating are/is heated and an adhesive between the carrier 102 and the reflective coating is thus cured.

However, in an application-specific manner it is not necessary for each conductor track 124 to be connected to a light-emitting component 108 and/or to be covered with a reflective coating 106 (illustrated in FIG. 2). By way of example, a conductor track 124 that is not directly connected to a light-emitting component 108 and/or a reflective coating (the conductor track 124 illustrated on the right in FIG. 2) can be used to realize different electrical interconnections of the light-emitting components 108.

Furthermore, the method comprises arranging 160 a light-emitting component 108 on or over the reflective coating 106. The light-emitting component 108 is electrically conductively connected to the at least one conductor track 104, 114 (two light-emitting components 108 are illustrated in FIG. 2). The plurality of light-emitting components 108 can be configured identically or differently to one another. By way of example, the light-emitting components 108 can emit light of different colors or be configured accordingly.

In various exemplary embodiments, the light-emitting component 108 comprises a light-emitting region 110 configured in relation to the carrier 102 in such a way that light is substantially emitted away from the carrier 102 (illustrated by means of the arrow 110 in FIG. 1). In various exemplary embodiments, at least one portion of the light emittable by the light-emitting component 108 can be emitted in the direction of the carrier 102 and be reflected at the reflective coating 106. The efficiency and luminous efficiency of the light-emitting device can be improved as a result.

FIG. 2 illustrates that at least one contact pad 130 can furthermore be formed on the surface of the carrier 102, said at least one contact pad being electrically conductively connected to the at least one conductor track 104, 114. In various exemplary embodiments, the reflective coating 106 is formed on or over the contact pad 130 in such a way that at least one part 132 of the contact pad 130 is exposed. As a result, the reflective coating 106 can act as a solder barrier structure for the contact pad 130. A solder barrier structure has the effect that a liquefied solder cannot run. The solder barrier structure thus acts as a dam structure or bank for a liquefied solder.

The light-emitting component 108 can be electrically conductively connected to the at least one conductor track 104, 114 by the exposed part 132 of the contact pad 130. By way of example, a soldered connection is formed between the light-emitting component 108 and the exposed part 132 of the contact pad 130, for example by means of a reflow soldering process.

In various exemplary embodiments, the carrier 102 comprises at least one first conductor track 104 and a second conductor track 114 electrically insulated from the first conductor track 104. The reflective coating 106 is formed with a first section formed directly on the first conductor track 104, and is formed with a second section formed directly on the second conductor track 114.

In various exemplary embodiments, the first section of the reflective coating 106 is electrically insulated from the second section of the reflective coating 106. In other words: the reflective coating 106 can have a lateral structuring comprising spatially separated regions.

The reflective coating should be formed from a material that is able to endure the manufacturing method for manufacturing the device comprising at least one light-emitting component without any damage or impairment of its function or of its physical properties, for example during a reflow soldering process.

In various exemplary embodiments, the reflective coating 106 is formed such that it is electrically conductive. By way of example, the reflective coating 106 comprises or is formed from a metal. The metal of the reflective coating 106 has for example a higher reflectivity than the material of the at least one conductor track 104, 114, 124.

In various exemplary embodiments, the reflective coating 106 is formed such that it is electrically nonconductive. By way of example, the nonconductive reflective coating 106 comprises highly reflective particles, for example composed of titanium oxide, embedded in a polymer matrix.

In various exemplary embodiments, the at least one light-emitting component 108 is arranged on or over the conductor structure by means of a cohesive connection method, for example by means of a reflow process of a solder or of solder balls arranged between light-emitting component 108 and contact pad 130, or the exposed region 132 thereof or an exposed conductor track.

The electrical linking of the light-emitting component to one or more conductor tracks 104 can alternatively or additionally be effected by means of adhesive bonding by means of an electrically conductive adhesive (anisotropic conductive film bonding—ACF bonding), a friction welding process (ultrasonic bonding) or the like.

One terminal or a plurality of terminals of the light-emitting component 108 can be electrically conductively connected for example to one or a plurality of contact pad(s) of the at least one conductor track 104. The light-emitting component 108 can be energized by an external power source by means of the conductor track 104, for example. The electrical connection of the electrical terminal to a contact pad and/or the conductor track 104 is mechanically secured by means of a soldered connection at a soldered joint, for example.

In various exemplary embodiments, the carrier 102 is or comprises a flexible film. By way of example, the carrier 102 is or comprises a plastics film. In various exemplary embodiments, the carrier 102 comprises a metallic coating.

In various exemplary embodiments, the carrier 102 is an FR1, FR2, FR3, FR4, FR5, CEM1, CEM2, CEM3, CEM4 or CEM5 printed circuit board, for example a plated-through hole FR4 printed circuit board.

The carrier 102 can be formed such that it is translucent or transparent. The carrier 102 serves as a carrier element for electronic elements or layers, for example the at least light-emitting component. The carrier 102 can comprise or be formed from, for example, glass, quartz, and/or a semiconductor material, or any other suitable material. Furthermore, the carrier 102 can comprise or be formed from a plastics film or a laminate comprising one or comprising a plurality of plastics films. The carrier 102 comprises for example a kapton film (polyimide, PI), a metal film or a PET film. By way of example, the carrier 102 can comprise or be formed from a steel film, a plastics film or a laminate comprising one or comprising a plurality of plastics films. The plastic can comprise or be formed from one or more polyolefins (for example high or low density polyethylene (PE) or polypropylene (PP)). Furthermore, the plastic can comprise or be formed from polyvinyl chloride (PVC), polystyrene (PS), polyester and/or polycarbonate (PC), polyethylene terephthalate (PET), polyethersulfone (PES), PEEK, PTFE and/or polyethylene naphthalate (PEN). The carrier 102 can comprise or be formed from a metal, for example copper, silver, gold, platinum, iron, for example a metal compound, for example steel. The carrier 102 can be formed as a metal film or a metal-coated film. The carrier 102 can comprise one or more of the materials mentioned above. The carrier 102 can be a part of a mirror structure or form the latter. The carrier 102 can comprise a mechanically rigid region and/or a mechanically flexible region or be formed in such a way.

In various exemplary embodiments, the carrier 102 can be a metal-coated film. The metal-coated film comprises for example a metal layer on a plastics film described above. The growth layer 104 can be formed directly on the plastics film. The metal layer can serve as a heat sink or heat conducting structure and/or a hermetically sealed layer vis-à-vis water and oxygen with respect to the plastics film and/or the at least one light-emitting component. The heat sink, the heat conducting structure or the metal layer can be configured for dissipating heat from the device, for example by virtue of the heat sink having a greater surface area, emissivity, a greater convection coefficient and/or a greater thermal conductivity than at least one further region of the device which is in thermal contact with the heat sink, for example a light-emitting component 108.

The metal layer is configured for example in such a way that as the product of its thickness d and its thermal conductivity k it has a value of greater than approximately 1000 μW/K, for example greater than approximately 5000 μW/K, for example greater than approximately 20000 μW/K. The thickness of the metal layer can for example be less than approximately 10 mm, for example be less than approximately 2 mm, for example be less than approximately 100 μm. The carrier 102 can be or comprise for example a film coated with aluminum or copper. Alternatively, the carrier 102 can be for example a graphene- or graphite-coated film.

In the context of this description, a light-emitting component 108 can be a semiconductor component which provides electromagnetic radiation, for example in the form of a wired light-emitting diode, a surface mounted light-emitting diode (surface mounted device SMD) or a chip-on-board light-emitting diode (die).

In the context of this description, a semiconductor chip which can provide electromagnetic radiation can be understood as an LED chip.

A light-emitting component 108 can for example comprise a semiconductor chip which provides electromagnetic radiation (wired LED, SMD), or be configured as a semiconductor chip which provides electromagnetic radiation (chip-on-board).

A package can be applied and/or formed on or over the semiconductor chip. The package can be formed for example as encapsulation, optical lens and/or as converter element.

A wired light-emitting diode can comprise a semiconductor chip which can provide electromagnetic radiation, for example an LED chip. The semiconductor chip can be encapsulated with a plastics cap, for example. The plastics cap can protect the LED chip from external, harmful influences, for example oxygen and/or water, during fabrication and during operation.

A surface mounted light-emitting diode (SMD) can comprise an LED chip in a package. The package can be cohesively fixed to a substrate.

A chip-on-board light-emitting diode can comprise an LED chip fixed on a substrate, wherein the LED chip can comprise neither a package nor contact pads.

The individual semiconductor chips can be applied or formed for example on a substrate, for example a printed circuit board.

The semiconductor chips can be wired to the printed circuit board by means of contact pads (wire bonding). The wirings can be effected by means of gold wires, for example.

In various exemplary embodiments, the light-emitting component 108 is configured as a laser diode.

FIG. 3 shows a schematic cross-sectional view concerning the method for producing a device comprising at least one light-emitting component in accordance with various embodiments.

In particular, FIG. 3 illustrates the process of forming 120 a reflective coating 106 directly on the at least one conductor track 104, 114 by means of a film transfer method in accordance with various exemplary embodiments.

The reflective coating 106 is attached to a temporary substrate 302 by means of a releasable coating 304. An adhesive layer 306 is attached on the opposite side, that is to say between the reflective coating 106 and the at least one conductor track 104. By means of a stamping die 300, the adhesive layer 306 is brought into contact with the carrier 102 and/or the at least one conductor track 104 (illustrated by means of the arrow in FIG. 3).

Afterward, by means of the adhesive layer 306, an adhesive connection is formed between the reflective coating 106 and the carrier 102 and/or the at least one conductor track 104, for example by means of pressure and heat during the hot film transfer method.

Furthermore, the temporary substrate 302 is detached, for example pulled off, from the reflective coating 106 by means of the releasable coating 304.

Illustratively, the adhesive connection between the reflective coating 106 and the carrier 102 and/or the at least one conductor track 104 is stronger than the adhesive connection between the reflective coating 106 and the releasable coating 304, for example in the plastic phase of the adhesive layer 306 after cooling in the hot film transfer method. By means of rapid cooling of the film after heating of the adhesive layer 306 in the hot film transfer method, the reflective coating 106 remains on or over the carrier 102, while the rest of the reflective coating next to the lateral structuring, that is to say that part of the reflective coating which is not intended to be applied on or over the carrier 102, remains on the temporary substrate 302 and is removed with the latter from the carrier 102.

The adhesive layer 306, the reflective coating 106, the releasable coating 304 and the temporary substrate 302 form a transfer film or are designated as such.

The adhesive layer 306, the reflective coating 106 and/or the stamping die 300 can have a lateral structuring in order to form the structured reflective coating 106 on or over the carrier 102. For roll-to-roll applications, the stamping die 300 can comprise a cylindrical die with embossed lateral structuring and thus form an embossing die. The embossing die can be flat for film piece applications.

Depending on the properties of the adhesive of the adhesive layer 306, the adhesive connection between the reflective coating and the carrier 102 and/or the at least one conductor track 104 can be formed by means of ultraviolet radiation, as an alternative to pressure and heat.

In the cold film transfer method, for example, an adhesive is imprinted on or over the carrier 102 according to a predefined, lateral structuring. Afterward, a transfer film with or without adhesive layer 306 is laminated onto the carrier 102. The reflective coating is arranged for example over the whole area or in an unstructured manner on the temporary substrate of the transfer film. As a result, the materials to be transferred adhere to the carrier 102 according to the printed adhesive, whereas other parts remain on the transfer film. Furthermore, the method can comprise brief thermal curing or UV curing, for example in the range of a few seconds, in order finally to form an adhesive connection between the reflective coating 106 and the carrier 102 and/or the at least one conductor track 104.

The surface quality of the reflective coating 106 formed on or over the (flexible) carrier 102 is defined by the surface quality of the temporary substrate 302 situated opposite the reflective coating. This surface of the temporary substrate 302 can be polished or given a matt finish in an application-specific manner. This makes possible a high-quality appearance for the light-emitting device formed.

In various configurations, the adhesive of the adhesive layer 306 can comprise or be formed from one of the following substances: a casein, a gelatin, a starch, a cellulose, a resin, a tannin, a lignin, an organic substance comprising oxygen, nitrogen, chlorine and/or sulfur; a metal oxide, a silicate, a phosphate, a borate.

In various configurations, the adhesive of the adhesive layer 306 can comprise or be formed from a hot melt adhesive, for example a solvent-containing wet adhesive, a contact adhesive, a dispersion adhesive, a water-based adhesive, a plastisol; a polymerization adhesive, for example a cyanoacrylate adhesive, a methyl methacrylate adhesive, an anaerobically curing adhesive, an unsaturated polyester, a radiation-curing adhesive; a polycondensation adhesive, for example a phenol formaldehyde resin adhesive, a silicone, a silane-crosslinking polymer adhesive, a polyimide adhesive, a polysulfide adhesive; and/or a polyaddition adhesive, for example an epoxy resin adhesive, a polyurethane adhesive, a silicone, a pressure sensitive adhesive.

In various exemplary embodiments, a hot melt adhesive can be a material for cohesively connecting two bodies, for example the light-emitting component 108 to the conductor track 104. The hot melt adhesive can be for example a material which is hard at room temperature and which, for connecting the bodies, is firstly liquefied and then hardened again. In this case, the hot melt adhesive can be brought into contact with the two bodies as early as before liquefaction or only in the liquid state. The hot melt adhesive can be liquefied in a convection oven or a reflow oven, for example. The hot melt adhesive can comprise for example a plastic, for example a synthetic resin, and/or a metal, for example a solder. The solder can comprise an alloy, for example. The solder can comprise for example lead, tin, zinc, copper, silver, aluminum, silicon and/or glass and/or organic or inorganic additives.

Figure 4:
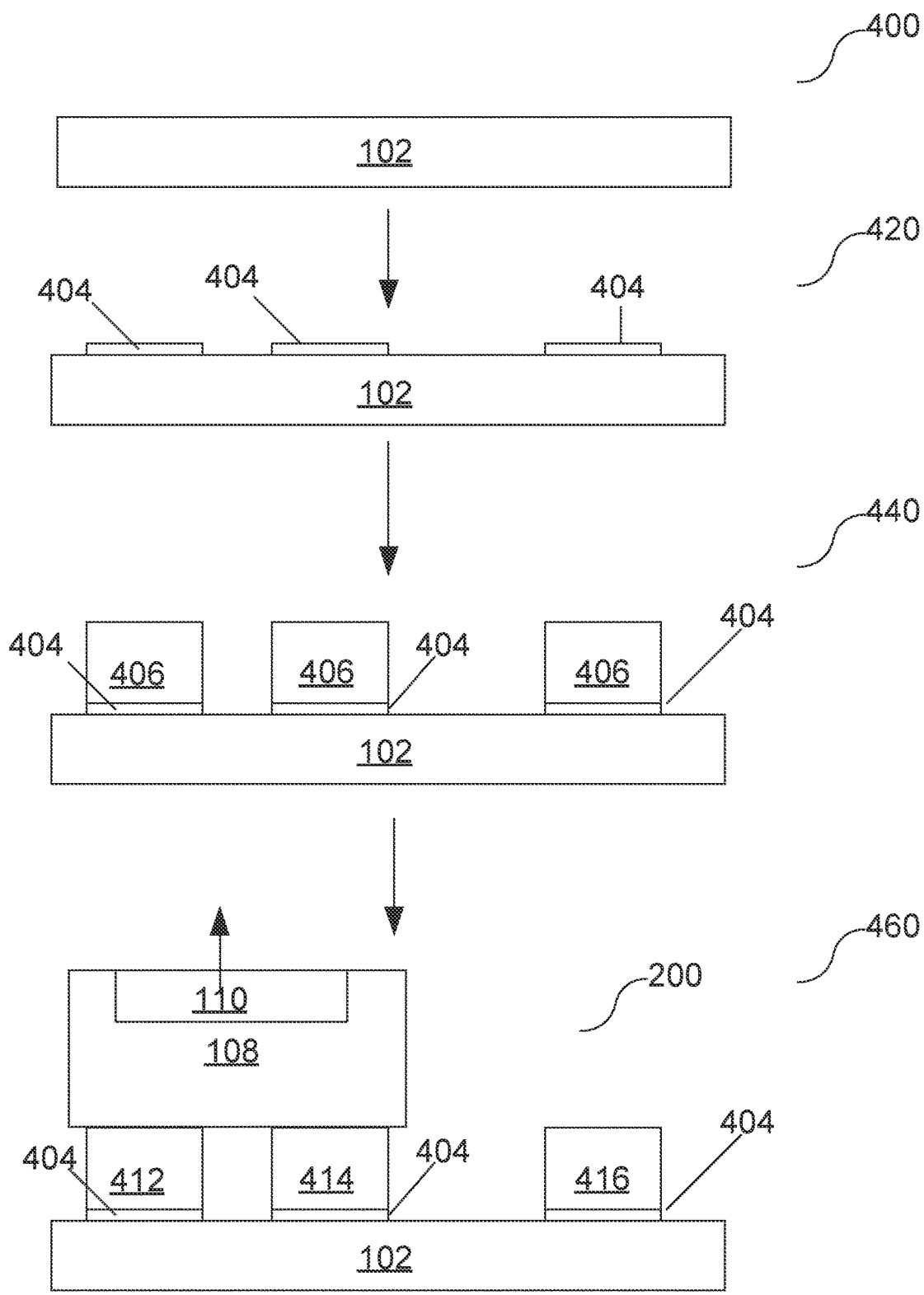
Figure 5:
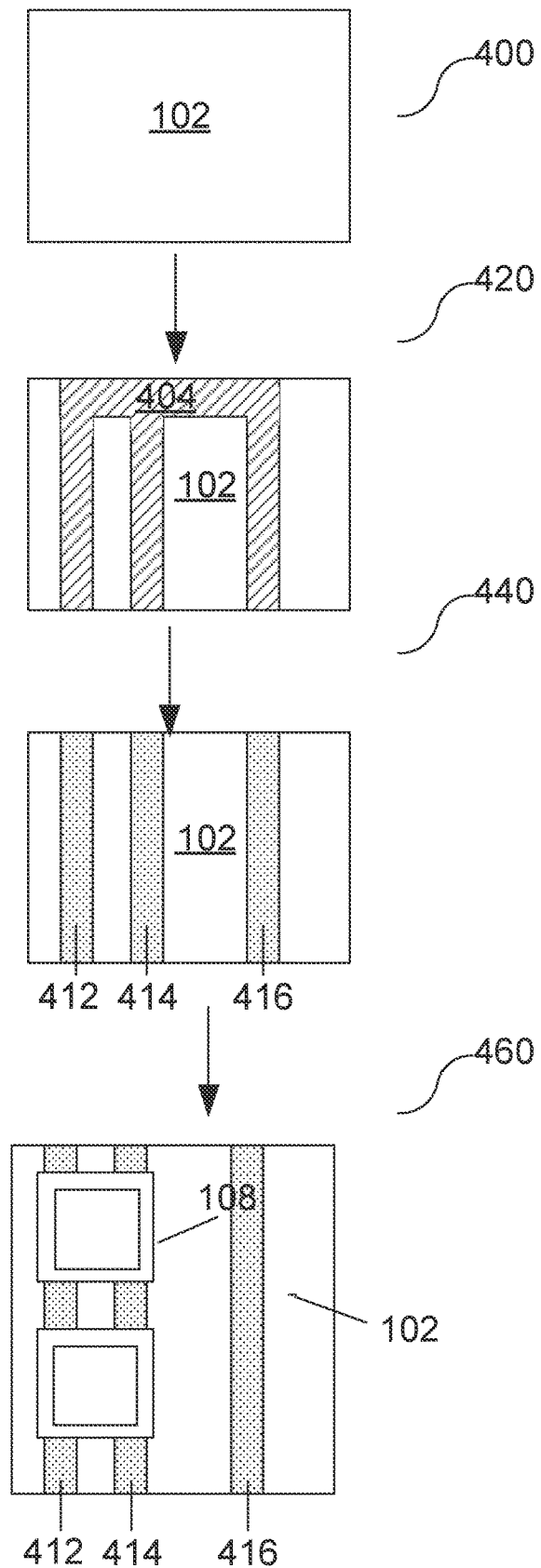

FIG. 4 shows schematic cross-sectional views and FIG. 5 shows schematic plan views concerning the method for manufacturing a device 200 comprising at least one light-emitting component 108 in accordance with various embodiments. The device 200 or the components thereof can be configured in accordance with an embodiment described above.

The method comprises providing 400 a carrier 102, forming 420 a growth layer 404 on the carrier 102, electrolytically depositing 440 an electrically conductive material directly on the growth layer 404, and arranging 460 the at least one light-emitting component 108 on or over the conductor structure 406.

In other words: the method for manufacturing the device comprising at least one light-emitting component comprises at least one additive or two-stage method in order to form the conductor structure. In this case, firstly a thin growth layer (also referred to as seed layer, or layout layer) is formed, wherein the growth layer has a lateral structuring (also referred to as layout).

This enables electrically conductive material of the conductor structure to be formed only where it is actually necessary, and with the required thickness, in order to realize the circuit in the printed circuit board, for example the flexible carrier with conductor structure with lateral structuring. In this case, specifically for light-emitting components, necessary requirements with regard to electrical conductivity, thermal conductivity, solderability and flame resistance can be taken into account in the design of the conductor structure. The conductor structure can occupy for example an area proportion in a range of approximately 5% to approximately 95% of a printable side of the carrier. A simpler and lean manufacturing process for devices comprising printed circuit boards is made possible as a result, which is manifested in lower costs for printed circuit boards. Furthermore, an environmentally acceptable manufacturing process is made possible, without a selective exposure process and an etching process being necessary.

The growth layer can be formed for example by means of physical vapor deposition through a reusable mask having the lateral structuring, or subtraction of unrequired material. Alternatively (non-exhaustively) the growth layer with lateral structuring can be realized by means of a film transfer in which the lateral structuring is realized already before the growth layer is applied on the carrier.

The growth layer has for example a thickness in a range of approximately 100 nm to approximately 1 μm and is electrically conductive. By way of example, the growth layer is formed from or comprises an electrically conductive material. The growth layer formed is subsequently used as an electrode for an electrolytic process in order to deposit an electrically conductive material directly on the growth layer, whereby the conductor structure with lateral structuring is formed. The conductor structure has a larger thickness, however, than that of the growth layer. In other words: the electrolytic deposition makes it possible to increase the thickness of the conductor structure, the lateral structure of which is defined by the growth layer. It is thereby possible to satisfy requirements with regard to electrical and thermal conductivity, solderability, adhesion of the conductor track to the carrier, and reliability, which are typical of lighting applications.

The lighting applications require a predefined or dedicated layout concept for the conductor structure in order to enable a maximum area coverage of the area with electrically conductive material of the conductor structure. This makes it possible to reduce the minimum thickness of the conductor structure, whereby the electrically conductive material of the conductor structure can be deposited more simply and more rapidly.

This enables for example metal of the conductor structure to be formed only where it is actually necessary, and with the required thickness, in order to realize the circuit in the flexible printed circuit board. In this case, specifically for light-emitting components, necessary requirements with regard to electrical conductivity, thermal conductivity, solderability and flame resistance can be taken into account in the design of the conductor structure. The conductor structure can occupy for example an area proportion in a range of approximately 5% to approximately 95% of a printable side of the carrier.

A simpler and lean manufacturing process for flexible printed circuit boards is made possible as a result, which is manifested in lower costs for printed circuit boards. By way of example, the conventional process of stopping the film or causing it to be stationary, for lighting purposes, becomes optional or is no longer necessary.

Furthermore, an environmentally acceptable manufacturing process is made possible, without a selective exposure process and an etching process being necessary.

By means of the additive process, moreover, less electrically conductive material, for example copper, is wasted during production. For areal lighting modules, large areas can be covered with electrically conductive material by means of the selective deposition of electrically conductive material, wherein electrically conductive material is deposited only where it is actually required.

For the case where the growth layer is fixed on the carrier by means of an adhesive, the thickness of said growth layer is optionally small compared with an adhesive layer used for example for laminating a copper film onto a plastics film and subsequent etching. The combustibility of the carrier with conductor structure and the material requirement can be reduced as a result.

The electrical conductivity and thermal conductivity of the conductor track(s) of the conductor structure are comparable to those of the bulk properties (bulk conductivity) of the electrically conductive material and similar to those of the conductor track(s) manufactured by means of etching, but are higher than those produced by other possible technologies, inter alia layouts printed with silver ink.

Furthermore, the overall quality yield of the flexible conductor track is higher, as a result of which the quantity of rejects can be reduced. This is of importance particularly for roll-to-roll manufacturing methods with electrically continuous conductor tracks. Just a single fault could otherwise already result in the interruption of the continuity of the continuous product, which would cause a high waste rate or reject rate.

Furthermore, fast processes are made possible.

Furthermore, roll-to-roll processes without gaps or interruptions or additional tolerances between the individual process steps are made possible.

Furthermore, a large film width can be made possible with standard machines used in the packaging industry, for example. The normally processable width of conventionally used FPC manufacturing methods based on etching processes can be increased as a result.

In various embodiments, a device is provided, comprising: a growth layer on a carrier, an at least partly electrolytically deposited conductor structure directly on the growth layer; and at least one light-emitting component on or over the conductor structure and electrically conductively connected to the latter.

In various embodiments, the growth layer 404 has the lateral structuring or is formed with such. The lateral structuring is illustrated by means of three structures arranged next to one another in the schematic cross-sectional view in FIG. 4. The lateral structuring can be continuously interconnected (illustrated as a comb-shaped structure in step 420 in FIG. 5) or comprise different regions which are each by themselves continuously connected (illustrated as three lines arranged separately next to one another in step 440 in FIG. 5).

The lateral structuring can comprise one or more conductor tracks, for example. The conductor tracks can be formed as line progressions, for example as a polygon progression. In other words: in various exemplary embodiments, the lateral structuring of the growth layer 404 comprises at least one conductor track which is continuous throughout.

In various exemplary embodiments, the lateral structuring additionally comprises at least one contact pad which is connected to the conductor track and configured for external electrical contacting, for example in a solderable manner.

The growth layer 404 formed is electrically conductive, such that the electrically conductive material for forming the conductor structure can be electrolytically deposited directly on the growth layer 404. As a result, a conductor structure 406 is formed on the growth layer 404. In this case, the conductor structure 406 can substantially or completely reproduce or copy the lateral structure of the growth layer 404. The cross section of an electrolytically formed conductor track of the conductor structure substantially shows a structure similar to a bulk structure of the electrically conductive material. Such a bulk structure differs for example from a printed structure of the electrically conductive material. By way of example, a printed copper conductor track exhibits irregularities in the copper particles of a copper-containing ink or printing paste and an electrical conductivity is achieved by means of the contact points between the particles. The conductivity of the conductor structure or of the conductor track(s) of the conductor structure similar to the bulk properties of the electrically conductive material is relevant to the properties of the flexible printed circuit board (FPC) since the electrical conductivity is higher than, for example, in the case of a printed conductor track with the same cross section.

In various exemplary embodiments, the growth layer 404 is formed by means of a film transfer on the carrier 102. The film transfer can be effected hot or cold, for example. Moreover, an adhesion promoter can (optionally) be used.

In the film transfer method, the growth layer 404 is attached to a temporary substrate, for example a PET film, by means of a releasable coating. The growth layer 404 is vapor-deposited on the releasable coating by means of a physical vapor deposition, for example. An adhesive layer is attached on the opposite side of the growth layer 404, that is to say between the growth layer 404 and the carrier 102. The adhesive layer can be formed, for example, by a roll of carrier 102, releasable coating and growth layer 404 "continuously" by way of an adhesive layer on the carrier 102. By means of a stamping die, the carrier 102 is brought into contact with the growth layer by the adhesive layer.

Afterward, by means of the adhesive layer, an adhesive connection is formed between the growth layer 404 and the carrier 102, for example by means of pressure and heat in the hot film transfer method.

Furthermore, the temporary substrate is detached, for example pulled off, from the growth layer 404 by means of the releasable coating.

In other words: only the growth layer remains on the adhesive layer. The temporary substrate can then be disposed of or reused.

Illustratively, the adhesive connection between the growth layer 404 and the carrier 102 is stronger than the adhesive connection between the growth layer 404 and the releasable coating, for example in the plastic phase of the adhesive layer after cooling in the hot film transfer method.

By means of rapid cooling of the film after heating of the adhesive layer in the hot film transfer method, the growth layer 404 remains on or over the carrier 102, while the rest of the growth layer 404 to be applied remains on the temporary substrate and is removed with the latter from the carrier 102.

The adhesive layer, the growth layer, the releasable coating and the temporary substrate form a transfer film or are designated as such.

The adhesive layer, the growth layer 404 and/or the stamping die can have a lateral structuring in order to form the structured growth layer 404 on or over the carrier 102. For roll-to-roll applications, the stamping die can comprise a cylindrical die with embossed lateral structuring and thus form an embossing die. The embossing die can be flat for film piece applications.

Depending on the properties of the adhesive of the adhesive layer, the adhesive connection between the reflective coating and the carrier 102 can be formed by means of ultraviolet radiation, as an alternative to pressure and heat.

In the cold film transfer method, for example, an adhesive is imprinted on or over the carrier 102 according to a predefined, lateral structuring. Afterward, a transfer film with or without adhesive layer is laminated onto the carrier 102. The growth layer 404 is arranged for example over the whole area or in an unstructured manner on the temporary substrate of the transfer film. As a result, the materials to be transferred adhere to the carrier 102 according to the printed adhesive, whereas other parts remain on the transfer film. Furthermore, the method can comprise brief thermal curing or UV curing, for example in the range of a few seconds, in order finally to form an adhesive connection between the growth layer 404 and the carrier 102.

The surface quality of the growth layer 404 formed on or over the (flexible) carrier 102 is defined by the surface quality of the temporary substrate situated opposite the growth layer 404. This surface of the temporary substrate can be polished or given a matt finish in an application-specific manner. This makes possible a high-quality appearance for the light-emitting device formed.

In other words: the electrically conductive material is arranged for this purpose with the lateral structuring on a releasable connection layer (release coater) over a temporary carrier, an adhesive layer and/or the adhesion promoter being applied on the surface of the electrically conductive material with the lateral structuring. By means of a stamping die and the adhesive layer and/or the adhesion promoter, the electrically conductive material with the lateral structuring is applied on the surface of the carrier 102, the adhesive layer being situated between the carrier 102 and the growth layer. The temporary carrier is pulled off from the electrically conductive material with the lateral structuring by means of the releasable connection layer, as a result of which the growth layer 404 with lateral structuring is formed on the carrier 102.

By way of example, the adhesive of the adhesive layer is a hot melt adhesive. Alternatively or additionally, the adhesive of the adhesive layer is an adhesive that cures by means of ultraviolet light (UV).

In other words: the adhesive of the adhesive layer can be a UV-curing adhesive that is applied and, since the growth layer, for example in the form of a copper layer, is thin, a UV flash is subsequently sufficient to cure the adhesive of the adhesive layer. In this case, the radiation of the UV flash passes through the thin growth layer. Alternatively or additionally, the adhesive of the adhesive layer is a thermoplastic which is applied to a thin, unstructured growth layer over the whole area, is appropriately melted by means of a cylindrical, hot embossing roller and adheres only at melted regions on the carrier 102. Further adhesives are described even more thoroughly below.

In various exemplary embodiments, the growth layer 404 is formed on the carrier 102 by means of a physical vapor deposition. By way of example, the material of the growth layer is deposited by means of physical vapor deposition over the whole area on the carrier with a thickness of for example 100 nm to approximately 1 μm, for example to approximately 200 nm. Afterward, material of the growth layer that is not required can be removed, for example pulled off, in order to form the lateral structuring in the growth layer. By way of example, molten copper from a copper bath is deposited as a uniform layer on a side of a carrier in the form of a film, which is guided by way of a roll, by means of physical vapor deposition (PVD) in a vacuum. In order to facilitate the removal of unrequired material of the growth layer in order to form the lateral structuring, beforehand between the material of the growth layer and the carrier an adhesion preventer can be formed in the regions in which no growth layer is provided in the lateral structuring, and then electrically conductive material can be deposited over the whole area of the surface of the carrier. The material of the growth layer has a lower adhesion and/or cohesion in regions with an adhesion preventer than in regions without an adhesion preventer. The process of forming the lateral structuring of the growth layer can be simplified as a result.

In various exemplary embodiments, the growth layer 404 is formed on the carrier 102 by means of a printing method, for example stamp printing, screen printing, rotogravure ink printing and/or inkjet printing. A printed growth layer 404 usually has a thickness of a few micrometers or less.

In various exemplary embodiments, the growth layer 404 comprises a plurality of regions electrically insulated from one another. As a result, it is possible for example to form a conductor structure with different materials or layer thicknesses.

In various exemplary embodiments, the growth layer 404 and the carrier 102 are configured in a manner electrically insulated from one another. In other words, there is no electrically conductive connection between the growth layer 404 and the carrier 102. By way of example, that surface of the carrier 102 on or over which the growth layer 404 is formed is formed by an electrically nonconductive material. Alternatively, the growth layer 404 and the carrier 102 are electrically conductively connected to one another.

In various exemplary embodiments, for the purpose of electrolytically depositing the electrically conductive material which forms the conductor structure, an electrical potential is applied to the growth layer 404. The electrical potential is dependent on the material of the growth layer and the material to be deposited electrolytically.

In various exemplary embodiments, the electrolytically deposited material is identical to the material of the growth layer 404. Alternatively, the electrolytically deposited material is different than the material of the growth layer 404. By way of example, the electrically conductive material is a metal, for example copper. In various exemplary embodiments, the growth layer 404 comprises one of the following materials, is formed therefrom or comprises an alloy thereof: copper, silver, chromium, magnesium. Alternatively or additionally, the electrically conductive material is or comprises a semimetal.

Before the electrolytic deposition, the method can furthermore comprise removing at least one part of the growth layer 404. As a result, at least one first conductor track and a second conductor track electrically insulated from the first conductor track can be formed (illustrated as separate conductor tracks 412, 414, 416 in FIG. 4 and FIG. 2). The first and second conductor tracks can thus have mutually different thicknesses or be formed from mutually different materials.

Before arranging the at least one light-emitting component 108, the method can furthermore comprise removing at least one part of the conductor structure 406. As a result, at least one first conductor track and a second conductor track electrically insulated from the first conductor track can be formed (illustrated in FIG. 5).

The conductor structure 406 comprises at least one conductor track, wherein said one conductor track has: a cross-sectional area in a range of approximately 0.02 mm$^2$ to approximately 4 mm$^2$; a width of the cross-sectional area in a range of approximately 0.5 mm to approximately 4 mm and/or a height of the cross-sectional area in a range of approximately 0.15 µm to approximately 400 µm, for example in a range of approximately 0.15 µm to approximately 100 µm.

In other words: in various exemplary embodiments, at least one conductor track, for example each conductor track, of the conductor structure 406 on or over which the light-emitting component 108 is arranged has a cross-sectional area in a range of approximately 0.02 mm$^2$ to approximately 4 mm$^2$. By way of example, a conductor track has in each case a height in a range of approximately 0.5 mm to approximately 4 mm. By way of example, a conductor track has in each case a width in a range of approximately 0.15 µm to approximately 400 µm, for example in a range of approximately 0.15 µm to approximately 100 µm.

In various exemplary embodiments, a conductor track is formed such that it is as wide as possible, wherein the width of the conductor track may be restricted solely by the electrical insulation with respect to the laterally adjacent conductor track. In various exemplary embodiments, a conductor track additionally has a method-governed minimum length.

In various exemplary embodiments, the electrolytically applied electrically conductive material of the conductor structure is a metal, for example copper, and is used for heat dissipation or for heat distribution or is optimized in this regard, for example with regard to the cross-sectional area and/or structuring.

At least one light-emitting component 108 is arranged on or over the conductor structure 406 and is electrically conductively connected to at least one conductor track 412, 414 of the conductor structure 406 (two light-emitting components 108 are illustrated in FIG. 5).

In various exemplary embodiments, the light-emitting component comprises a light-emitting region configured in relation to the carrier in such a way that light is emitted substantially away from the carrier 102 (illustrated by means of the arrow 110 in FIG. 1). In various exemplary embodiments, the carrier 102 can be configured such that it is transparent and at least one portion of the light emittable by the light-emitting component 108 is emitted through the carrier 102.

However, in an application-specific manner it is not necessary for each conductor track of the conductor structure 406 to be connected to a light-emitting component 108 (illustrated in FIG. 5). By way of example, a conductor track which is not directly connected to a light-emitting component 108 (the conductor track illustrated on the right in FIG. 2) can be used to realize different electrical interconnections of the light-emitting components 108.

The plurality of light-emitting components 108 can be configured identically or differently to one another. By way of example, the light-emitting components 108 can emit light of different colors or be configured accordingly.

The device 200 comprising at least one light-emitting component 108 which is thus formed comprises: a growth layer 404 on a carrier 102, an at least partly electrolytically deposited conductor structure 406 directly on the growth layer 404; and at least one light-emitting component (108) on or over the conductor structure 406 and electrically conductively connected to the latter.

In the context of this description, a light-emitting component 108 can be a semiconductor component which provides electromagnetic radiation, for example in the form of a wired light-emitting diode, a surface mounted light-emitting diode (surface mounted device SMD) or a chip-on-board light-emitting diode (die).

In the context of this description, a semiconductor chip which can provide electromagnetic radiation can be understood as an LED chip.

A light-emitting component 108 can for example comprise a semiconductor chip which provides electromagnetic radiation (wired LED, SMD, for example a packaged LED), or be configured as a semiconductor chip which provides electromagnetic radiation (chip-on-board).

In various exemplary embodiments, the light-emitting component 108 is a semiconductor chip in the form of a flip-chip in which at least two contacts are formed on the rear side of the semiconductor chip (and face the carrier 102). An electrical contacting can be effected without wire bonding, for example by means of solder balls, for example in a reflow process.

A package can be applied and/or formed on or over the semiconductor chip. The package can be formed for example as encapsulation, optical lens and/or as converter element.

A wired light-emitting diode can comprise a semiconductor chip which can provide electromagnetic radiation, for example an LED chip. The semiconductor chip can be encapsulated with a plastics cap, for example. The plastics cap can protect the LED chip from external, harmful influences, for example oxygen and/or water, during fabrication and during operation.

A surface mounted light-emitting diode (SMD) can comprise an LED chip in a package. The package can be cohesively fixed to a substrate.

A chip-on-board light-emitting diode can comprise an LED chip fixed on a substrate, wherein the LED chip can comprise neither a package nor contact pads.

The individual semiconductor chips can be applied or formed for example on a substrate, for example a printed circuit board.

The semiconductor chips can be wired to the printed circuit board by means of contact pads (wire bonding). The wirings can be effected by means of gold wires, for example.

In various exemplary embodiments, the light-emitting component 108 is configured as a laser diode.

In various exemplary embodiments, the light-emitting component 108 is a semiconductor chip in which one contact is formed on the rear side of the semiconductor chip and one contact on the front side of the semiconductor chip. The semiconductor chip can be electrically contacted by means of a wire (wire bonding).

In various exemplary embodiments, the at least one light-emitting component 108 is arranged on or over the conductor structure by means of a cohesive connection method, for example by means of a reflow process of a solder or of solder balls arranged between light-emitting component 108 and conductor structure 406.

The electrical linking of the light-emitting component to one or more conductor tracks of the conductor structure 406 can alternatively or additionally be effected by means of adhesive bonding by means of an electrically conductive adhesive (anisotropic conductive film bonding—ACF bonding), a friction welding process (ultrasonic bonding) or the like.

One terminal or a plurality of terminals of the light-emitting component 108 can be electrically conductively connected for example to one or a plurality of contact pad(s) of the conductor structure 406. The light-emitting component 108 can be energized by an external power source by means of the conductor structure 406, for example. The electrical connection of the electrical terminal to a contact pad and/or a conductor track of the conductor structure 406 is mechanically secured by means of a soldered connection at a soldered joint, for example.

In various embodiments, the growth layer 404 is adhesively bonded or laminated onto the carrier 102 by means of an adhesive. The layer of adhesive can also be referred to as adhesion medium layer.

The adhesive, the semiconductor component and/or the carrier of the embodiment illustrated in FIG. 4 and FIG. 5 can be configured in particular in accordance with an embodiment described above.

Various exemplary embodiments are described below:

Example 1 is a method for manufacturing a light-emitting device. The method comprises: forming a carrier with at least one conductor track on a surface of the carrier; forming a reflective coating directly on the at least one conductor track by means of a film transfer method in such a way that the conductor track is substantially covered by the reflective coating; and arranging a light-emitting component on or over the reflective coating, wherein the light-emitting component is electrically conductively connected to the at least one conductor track.

In example 2, the method according to example 1 optionally comprises the fact that at least one contact pad is furthermore formed on the surface of the carrier, said at least one contact pad being electrically conductively connected to the at least one conductor track, and the fact that the reflective coating is formed on or over the contact pad in such a way that at least one part of the contact pad is exposed.

In example 3, the method according to example 1 or 2 optionally comprises the fact that the reflective coating is furthermore formed as a solder barrier structure for the contact pad.

In example 4, the method according to example 3 optionally comprises the fact that the light-emitting component is electrically conductively connected to the at least one conductor track by the contact pad.

In example 5, the method according to either of examples 3 and 4 optionally comprises the fact that a soldered connection is formed between the light-emitting component and the contact pad.

In example 6, the method according to any of examples 1 to 5 optionally comprises the fact that the carrier comprises at least one first conductor track and a second conductor track electrically insulated from the first conductor track, and the reflective coating comprises a first section formed directly on the first conductor track, and comprises a second section formed directly on the second conductor track, wherein the first section is electrically insulated from the second section.

In example 7, the method according to any of examples 1 to 6 optionally comprises the fact that the reflective coating is formed such that it is electrically conductive, in particular comprises an electrically conductive material.

In example 8, the method according to any of examples 1 to 6 optionally comprises the fact that the reflective coating is formed such that it is electrically nonconductive, in particular comprises an electrically nonconductive material.

In example 9, the method according to any of examples 1 to 8 optionally comprises the fact that the reflective coating is applied on or over the carrier by means of a cold film transfer method.

In example 10, the method according to any of examples 1 to 8 optionally comprises the fact that the reflective coating is applied on or over the carrier by means of a hot film transfer method.

Example 11 is a method for producing a device comprising at least one light-emitting component. The method comprises: forming a growth layer on a carrier, wherein the growth layer has a lateral structuring and is electrically conductive; electrolytically depositing an electrically conductive material directly on the growth layer in such a way that a conductor structure with the lateral structuring is formed on the growth layer; and arranging the at least one light-emitting component on or over the conductor structure, wherein the at least one light-emitting component is electrically conductively connected to the conductor structure.

In example 12, the method according to example 11 optionally comprises the fact that the carrier is or comprises a flexible film, for example a plastics film.

In example 13, the method according to either of examples 11 and 12 optionally comprises the fact that the carrier comprises a metallic coating.

In example 14, the method according to any of examples 11 to 13 optionally comprises the fact that the growth layer is formed on the carrier by means of a film transfer.

In example 15, the method according to any of examples 11 to 13 optionally comprises the fact that the growth layer is formed on the carrier by means of a physical vapor deposition.

In example 16, the method according to any of examples 11 to 13 optionally comprises the fact that the growth layer is formed on the carrier by means of a printing method, for example stamp printing, screen printing and/or inkjet printing.

In example 17, the method according to any of examples 11 to 16 optionally comprises the fact that the lateral structuring of the growth layer comprises at least one conductor track which is continuous throughout.

In example 18, the method according to any of examples 11 to 17 optionally comprises the fact that the electrolytically deposited material is identical to the material of the growth layer.

In example 19, the method according to any of examples 11 to 17 optionally comprises the fact that the electrolytically deposited material is different to the material of the growth layer.

In example 20, the method according to any of examples 11 to 19 optionally comprises the fact that the growth layer comprises one of the following materials, is formed therefrom or comprises an alloy thereof: copper, silver, chromium, magnesium.

In example 21, the method according to any of examples 11 to 20 optionally comprises the fact that before arranging the at least one light-emitting component, the method furthermore comprises removing at least one part of the conductor structure, such that at least one first conductor track and a second conductor track electrically insulated from the first conductor track are formed.

In example 22, the method according to any of examples 11 to 21 optionally comprises the fact that the at least one light-emitting component is arranged on or over the conductor structure by means of a cohesive connection method, for example by means of a reflow process.

In example 23, the method according to any of examples 11 to 21 optionally comprises the fact that for the electrolytic deposition, an electrical potential is applied to the growth layer.

Example 24 is a device comprising: a growth layer on a carrier, an at least partly electrolytically deposited conductor structure directly on the growth layer; and at least one light-emitting component on or over the conductor structure and electrically conductively connected to the latter.

In example 25, the device according to example 24 optionally comprises the fact that the conductor structure comprises at least one conductor track, wherein the conductor track has: a cross-sectional area in a range of approximately 0.02 mm$^2$ to approximately 4 mm$^2$. By way of example, a conductor track has in each case a height in a range of approximately 0.5 mm to approximately 4 mm. By way of example, a conductor track has in each case a width in a range of approximately 0.15 µm to approximately 100 µm.

In example 26, the device according to example 24 or 25 optionally comprises the fact that the carrier is or comprises a flexible film, for example a plastics film.

In example 27, the device according to any of examples 24 to 26 optionally comprises the fact that the carrier comprises a metallic coating.

In example 28, the device according to any of examples 24 to 27 optionally comprises the fact that the growth layer is formed by means of a film transfer on the carrier. In other words: the growth layer is a film transfer layer.

In example 29, the device according to any of examples 24 to 28 optionally comprises the fact that the growth layer is formed by means of a physical vapor deposition (PVD) on the carrier. In other words: the growth layer is a PVD layer.

In example 30, the device according to any of examples 24 to 29 optionally comprises the fact that the growth layer is formed on the carrier by means of a printing method, for example by means of stamp printing, screen printing and/or inkjet printing. In other words: the growth layer is a wet-chemically printed layer.

In example 31, the device according to any of examples 24 to 30 optionally comprises the fact that the lateral structuring of the growth layer comprises at least one conductor track which is continuous throughout.

In example 32, the device according to any of examples 24 to 31 optionally comprises the fact that the electrolytically deposited material is identical to the material of the growth layer.

In example 33, the device according to any of examples 24 to 32 optionally comprises the fact that the electrolytically deposited material is different to the material of the growth layer.

In example 34, the device according to any of examples 24 to 33 optionally comprises the fact that the growth layer comprises one of the following materials, is formed therefrom or comprises an alloy thereof: copper, silver, chromium, magnesium.

In example 35, the device according to any of examples 24 to 34 comprises the fact that the conductor structure comprises at least one first conductor track and a second conductor track electrically insulated from the first conductor track.

In example 36, the device according to any of examples 24 to 35 optionally comprises the fact that the at least one light-emitting component is arranged on or over the conductor structure and is connected to the latter by means of a cohesive connection method, for example by means of a reflow process.

LIST OF REFERENCE SIGNS 100, 120, 140, 400, 420, 440, 460 Method steps
102 Carrier
104, 114, 124, 412, 414, 416 Conductor tracks
106 Reflective coating
108 Light-emitting component
110 Light emission direction
130 Contact pad
132 Exposed part of a contact pad
200 Light-emitting device
300 Stamping die
302 Temporary substrate
304 Releasable coating
306 Adhesive layer
404 Growth layer
406 Conductor structure

The invention claimed is:

1. A method for manufacturing a light-emitting device, the method comprising:
   forming a carrier with at least one conductor track on a surface of the carrier;
   forming a reflective coating directly on the at least one conductor track by a film transfer method in such a way that the conductor track is substantially covered by the reflective coating; and
   arranging a light-emitting component on or over the reflective coating, wherein the light-emitting component is electrically conductively connected to the at least one conductor track.

2. The method as claimed in claim 1,
   further comprising forming at least one contact pad on the surface of the carrier, said at least one contact pad being electrically conductively connected to the at least one conductor track, and
   wherein the reflective coating is formed on or over the contact pad in such a way that the contact pad is at least partially exposed.

3. The method as claimed in claim 1,
   wherein the reflective coating is formed as a solder barrier structure for the contact pad.

4. The method as claimed in claim 3,
   wherein the light-emitting component is electrically conductively connected to the at least one conductor track by the contact pad.

5. The method as claimed in claim 3,
   wherein a soldered connection is formed between the light-emitting component and the contact pad.

6. The method as claimed in claim 1,
   wherein the carrier comprises at least one first conductor track and a second conductor track electrically insulated from the at least one first conductor track, and wherein the reflective coating comprises a first section formed directly on the first conductor track, and comprises a second section formed directly on the second conductor track, wherein the first section is electrically insulated from the second section.

7. The method as claimed in claim 1,
   wherein the reflective coating is electrically conductive.

8. The method as claimed in claim 1,
   wherein the reflective coating is electrically nonconductive.

9. The method as claimed in claim 1,
   wherein the reflective coating is applied on or over the carrier by a cold film transfer method.

10. The method as claimed in claim 1,
    wherein the reflective coating is applied on or over the carrier by a hot film transfer method.

11. The method as claimed in claim 1, wherein the reflective coating comprises an electrically conductive material.

12. The method as claimed in claim 1, wherein the reflective coating comprises an electrically nonconductive material.

* * * * *